(12) United States Patent
Volpe et al.

(10) Patent No.: US 11,048,644 B1
(45) Date of Patent: Jun. 29, 2021

(54) MEMORY MAPPING IN AN ACCESS DEVICE FOR NON-VOLATILE MEMORY

(71) Applicant: Amazon Technologies, Inc., Seattle, WA (US)

(72) Inventors: Thomas A. Volpe, Austin, TX (US); Mark Anthony Banse, Austin, TX (US); Steven Scott Larson, Georgetown, TX (US)

(73) Assignee: Amazon Technologies, Inc., Seattle, WA (US)

( * ) Notice: Subject to any disclaimer, the term of this patent is extended or adjusted under 35 U.S.C. 154(b) by 306 days.

(21) Appl. No.: 15/838,297

(22) Filed: Dec. 11, 2017

(51) Int. Cl.
| | | |
|---|---|---|
| *G06F 12/10* | (2016.01) | |
| *G06F 30/33* | (2020.01) | |
| *G06F 12/1072* | (2016.01) | |
| *G11C 11/4072* | (2006.01) | |
| *G06F 11/07* | (2006.01) | |
| *G11C 29/00* | (2006.01) | |

(Continued)

(52) U.S. Cl.
CPC ........ *G06F 12/1072* (2013.01); *G06F 3/0613* (2013.01); *G06F 3/0656* (2013.01); *G06F 3/0658* (2013.01); *G06F 3/0688* (2013.01); *G06F 11/073* (2013.01); *G06F 11/0727* (2013.01); *G06F 11/0793* (2013.01); *G06F 12/10* (2013.01); *G06F 12/1009* (2013.01); *G06F 30/331* (2020.01); *G11C 11/4072* (2013.01); *G11C 29/76* (2013.01); *G06F 2212/2022* (2013.01); *G06F 2212/313* (2013.01); *G06F 2212/7203* (2013.01); *G11C 2211/5641* (2013.01)

(58) Field of Classification Search
CPC ................ G11C 11/4072; G11C 29/76; G11C 2211/5641; G06F 11/0727; G06F 11/073; G06F 11/0793; G06F 2212/2022; G06F 2212/313; G06F 2212/7203; G06F 12/10; G06F 12/1009; G06F 12/1027; G06F 12/1072; G06F 12/1081; G06F 12/109; G06F 30/331; G06F 3/0613; G06F 3/0658; G06F 3/0656; G06F 3/0688
USPC ........................................................ 711/103
See application file for complete search history.

(56) References Cited

U.S. PATENT DOCUMENTS

| | | | | |
|---|---|---|---|---|
| 5,960,464 A | * | 9/1999 | Lam ...................... | G06F 12/126 711/206 |
| 6,038,443 A | * | 3/2000 | Luneau ............... | H04L 12/2854 379/142.01 |

(Continued)

OTHER PUBLICATIONS

Intel Debuts Programmable Acceleration Card by Doug Black (Year: 2017).*

(Continued)

*Primary Examiner* — Paul M Knight
(74) *Attorney, Agent, or Firm* — Robert C. Kowert; Kowert, Hood, Munyon, Rankin & Goetzel, P.C.

(57) ABSTRACT

An access device may be implemented to provide one or more access channels to non-volatile memory. Memory mapping implemented at the access device may direct a memory controller of the access device to perform access requests, replacing an initial storage location with a different storage location to access in the non-volatile memory device. Address scrambling, encryption, and other modifications to performing an access request may be implemented at the access device, in some embodiments, in addition to the memory mapping techniques.

20 Claims, 11 Drawing Sheets

(51) Int. Cl.
*G06F 12/1009* (2016.01)
*G06F 3/06* (2006.01)
*G06F 30/331* (2020.01)

(56) References Cited

U.S. PATENT DOCUMENTS

| | | | |
|---|---|---|---|
| 7,120,729 | B2 | 10/2006 | Gonzalez et al. |
| 7,526,598 | B2 | 4/2009 | Stern et al. |
| 7,958,430 | B1 | 6/2011 | Kolokowsky et al. |
| 8,185,685 | B2 | 5/2012 | Selinger |
| 8,412,985 | B1 | 4/2013 | Bowers et al. |
| 9,158,671 | B2 | 10/2015 | Ryu et al. |
| 10,402,124 | B2 * | 9/2019 | Guim Bernat ........ G06F 9/5077 |
| 2007/0168643 | A1 * | 7/2007 | Hummel ............. G06F 12/1009 711/207 |
| 2008/0098196 | A1 * | 4/2008 | Miyamoto .......... G06F 12/1081 711/203 |
| 2009/0049220 | A1 * | 2/2009 | Conti ...................... G06F 13/24 710/267 |
| 2009/0182976 | A1 * | 7/2009 | Agesen ............... G06F 12/1009 711/207 |
| 2016/0232105 | A1 * | 8/2016 | Goss ..................... G06F 21/575 |
| 2017/0083240 | A1 * | 3/2017 | Rogers ................... G06F 13/28 |
| 2017/0132163 | A1 * | 5/2017 | Aslot .................... G06F 3/0619 |
| 2017/0242811 | A1 * | 8/2017 | Tsirkin ................ G06F 9/45558 |
| 2017/0270051 | A1 * | 9/2017 | Chen ................... G06F 12/1027 |
| 2018/0074975 | A1 * | 3/2018 | Deutsch ................ H04L 9/0637 |
| 2018/0315399 | A1 * | 11/2018 | Kaul ..................... G06F 7/5443 |
| 2019/0005176 | A1 * | 1/2019 | Illikkal ................. G06F 3/0628 |

OTHER PUBLICATIONS

Generating Cryptographic Keys: Will Your Random No. Generators (PRNGs) Do The Job? by Chuck Easttom (guest) on Feb. 22, 2017 (Year: 2017).*
Memory System by Jacob (Year: 2007).*
An FPGA-based In-line Accelerator for Memcached by Lavasani (Year: 2014).*
A Log Buffer-Based Flash Translation Layer Using Fully-Associative Sector Translation by Lee (Year: 2007).*
Comparing and Combining GPU and FPGA Accelerators in an Image Processing Context by Silva (Year: 2013).*
Efficient Virtual Memory Sharing via On-Accelerator Page Table Walking in Heterogeneous Embedded SoCs by Vogel (Year: 2017).*
U.S. Appl. No. 15/717,763, filed Sep. 27, 2017, Volpe, et al.
U.S. Appl. No. 15/717,759, filed Sep. 27, 2017, Volpe, et al.

* cited by examiner

MEMORY MAPPING IN AN ACCESS DEVICE FOR NON-VOLATILE MEMORY

BACKGROUND

Non-volatile memory offers opportunities to bridge the shortcomings of other types of data storage. With access speeds faster than traditional block-based storage devices, non-volatile memory can increase the capacity of an implementing system to store information for data intensive applications that utilize large amounts of memory as the cost per unit of storage (e.g., dollars per Gigabyte) may be significantly less. Moreover, non-volatile memory can be accessible to a system in a manner similar to volatile system memory, while offering greater granularity for applications and other software or hardware resources utilizing non-volatile memory to store smaller amounts of specific data (e.g., byte addressable as opposed to block addressable) in a persistent form. Techniques that improve the speed of accessing and managing non-volatile memory are thus highly desirable.

Figure 1:
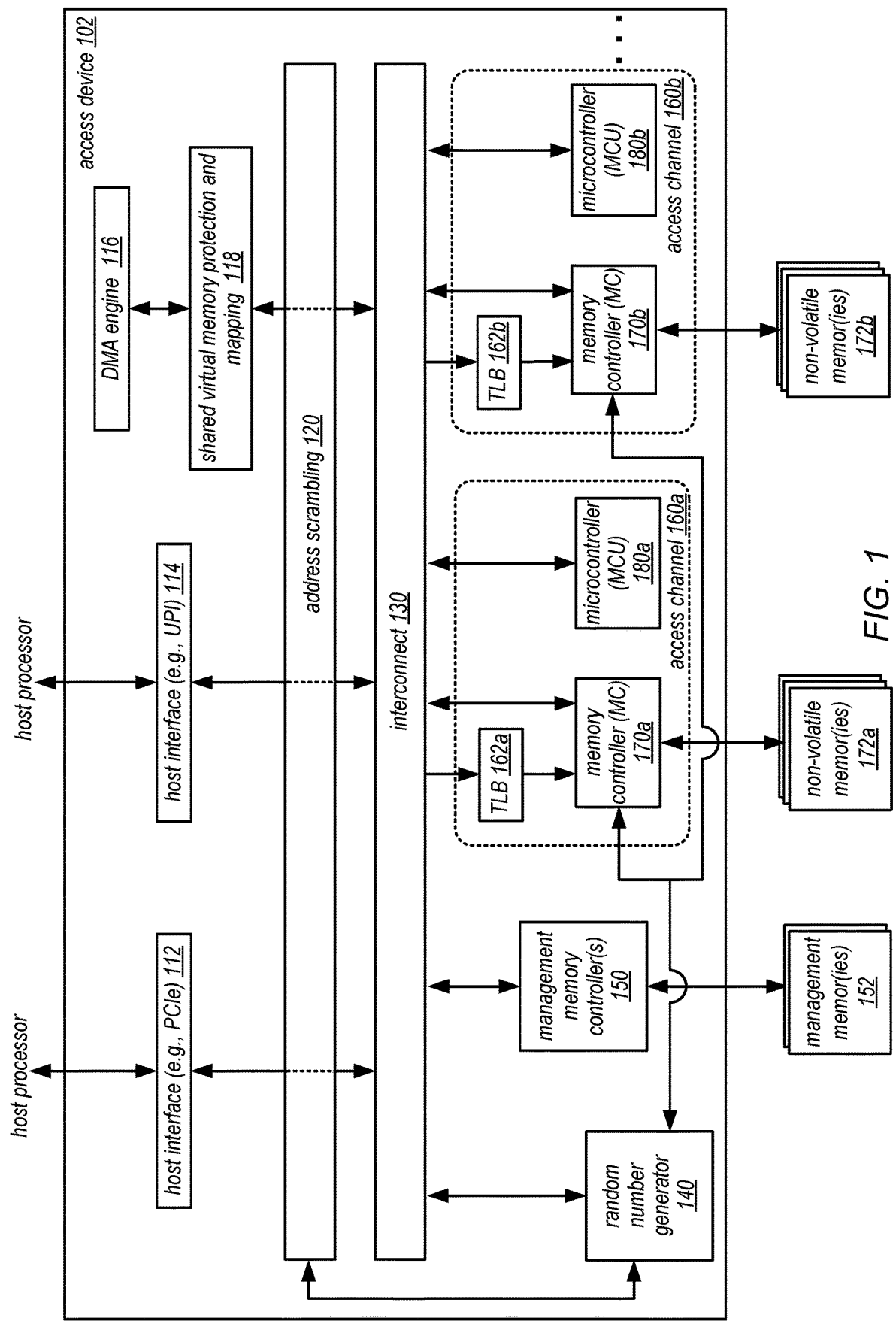
FIG. 1 illustrates a logical block diagram of memory mapping in an access device for directing memory controller access to a non-volatile memory, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various embodiments of memory mapping in an access device for a non-volatile memory are described herein.

Non-volatile memory offers performance characteristics that provide different optimization opportunities for accessing and managing data stored thereon. Faster access times may be taken advantage of by a hardware memory controller performing reads and writes to data in the non-volatile memory without the intervention of software-implemented access handling (e.g., by firmware implemented in a microcontroller), reducing latency in the access path, in various embodiments. Complex management operations can be moved into a separate microcontroller that steps in to help with managing non-volatile memory in differing scenarios, in some embodiments. The resulting division of labor may allow for increased access performance to non-volatile memories without sacrificing the sophisticated management techniques applicable through hardware and software to perform more complex operations, in various embodiments.

Because management operations may include operations that move data from different physical storage locations (e.g., addresses) within a non-volatile memory, requests to access a storage location may be mapped or otherwise abstracted from the physical storage location. An instruction to access a storage location in the non-volatile memory may be evaluated and translated into the physical storage location that holds the desired data (which may be different from the location in the instruction or have moved since the data was last accessed). In order to preserve the high-performance obtained by processing access requests directly through the hardware memory controller, hardware memory mapping may provide translated or otherwise modified storage locations that point to the physical storage location of desired data directly to the memory controller, without microcontroller involvement, in some embodiments.

In such embodiments, direct memory mapping may provide address translation that is hidden from hosted resources (e.g., such as a virtualization platform like a hypervisor and a virtual computing resource, like a virtual machine instance operating on the virtualization platform). Instead, the non-volatile memory may be accessed or otherwise treated as if it was additional system memory (e.g., in addition to volatile memory made available to the hosted resources). Moreover, because hosted resources need not implement memory mapping, the hosted resources do not have to utilize resources (e.g., central processing unit (CPU) cycles or communication bandwidth) to perform memory mapping evaluation or allocation. Furthermore, by making the non-volatile memory appear to hosted resources as additional memory, the configuration or implementation (e.g., code) for implementing the hosted resources does not have to be modified (e.g., the memory management component of a virtualization platform would not have to be altered to utilize the non-volatile memory).

Moving responsibility for memory mapping to an access device that provides access to non-volatile memory via a hardware memory controller separate from a microcontroller may also grant hosted resources with additional flexibility, in some embodiments. For example, virtualization platforms may utilize large page sizes to map the address space of non-volatile memory. Moving responsibility for memory mapping to the access device may also allow for other security features and performance enhancements, such as address scrambling and per-resource encryption as discussed below to be implemented without host resource involvement, keeping security information safe from malicious analysis or access that may compromise or utilize host resources.

FIG. 1 illustrates a logical block diagram of memory mapping in an access device for directing memory controller access to a non-volatile memory, according to some embodiments. Access device 102 may be implemented to provide one or more as dedicated hardware channels to access one or multiple non-volatile memories, such as access channel 160a to access non-volatile memor(ies) 172a and access channel 160b to access non-volatile memor(ies) 172b, in various embodiments. Access device 102 may be implemented as an application specific integrated circuit (ASIC), field programmable gate array (FPGA), system-on-a-chip (SoC), or other dedicated circuitry that processes various access requests from host processor(s) for non-volatile memor(ies) 172. In some embodiments, access device 102 may be implemented on the silicon as the host processor.

Access device 102 may implement one or more interfaces, such as interface 112 and 114 to receive access requests from a host processor. For example, interface 112 may include Peripheral Component Interconnect Express (PCIe) interface that can receive load/store instructions for byte addressable access to data in non-volatile memor(ies) 170a, block addressable I/O requests (e.g., using small computer systems interface (SCSI), or requests to perform a direct memory access (DMA) using DMA engine 116. Multiple different types of interfaces may be implemented in some embodiments. For example, host interface 114 may be an interface that accepts hosts' requests in Intel UltraPath Interconnect (UPI) format. In some embodiments, different interface types may be implemented in order to take advantage of different interface capabilities. A UPI host interface, such as host interface 114, may provide access to non-volatile memor(ies) 172 that is cacheable, whereas a PCIe interface, such as host interface 112, may provide non-cacheable access to non-volatile memor(ies) 172, in some embodiments.

Figure 9A:
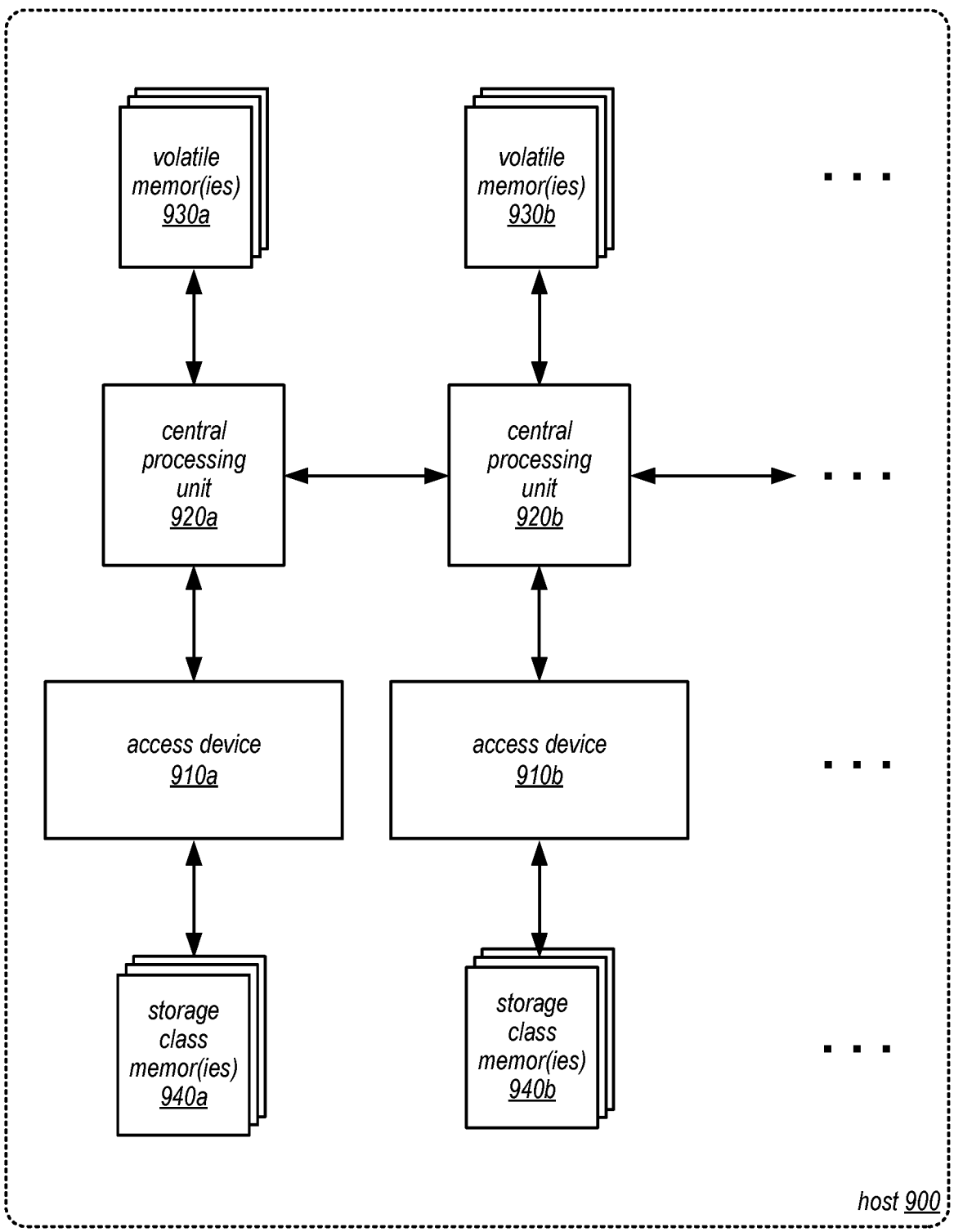
FIGS. 9A-9B are logical block diagrams illustrating various configurations of access devices, host processors, non-volatile memories, and other memories, according to some embodiments.
Figure 9B:
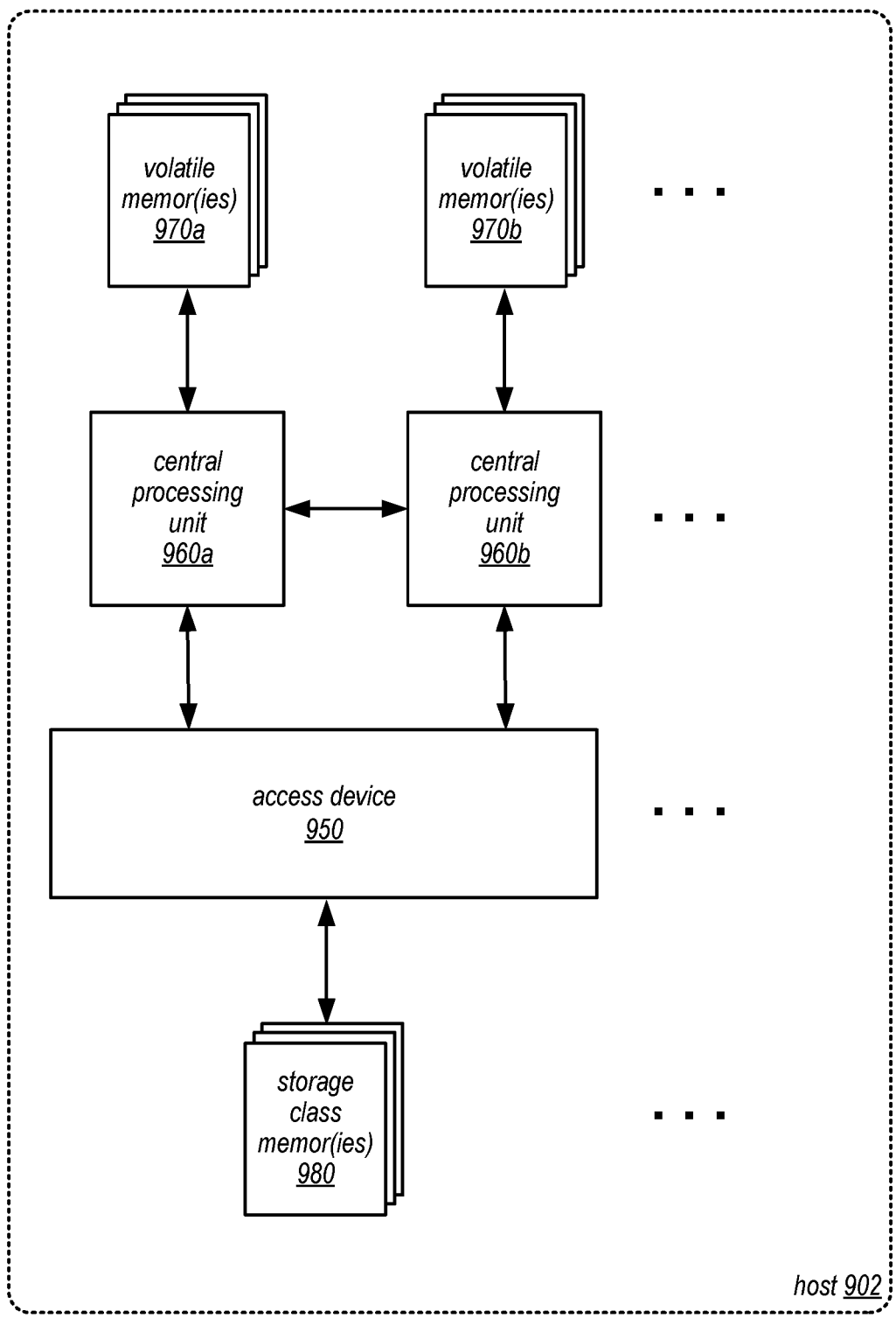

In some embodiments, access device may implement DMA engine 116 to perform DMA operations over a host interface (e.g., 112 or 114) to or from a host memory (e.g., volatile memor(ies) 930a or 930b in FIG. 9A or volatile memor(ies) 970a or 970b in FIG. 9B). DMA engine 116 may generate write or read requests in order to carry out DMA operations, which may be utilize an access channel 160 to access non-volatile memor(ies) 172. In at least some embodiments, DMA engine 116 may implement enhanced DMA (eDMA). In some embodiments, access device 102 may implement shared virtual memory protection and mapping 118. For example, shared virtual memory protection and mapping 118 may implement a memory management unit (MMU) or other mapping information so that virtual computing resources (e.g., guest domains or instances) may utilize virtual physical addressing to move data between non-volatile memories and volatile or other system memories for a host without straying into other resource or management data.

Instructions to cause an access to non-volatile memor(ies) 172 may be received via a host interface (e.g., 112 or 114) and may be dispatched to the appropriate access device component via interconnect 130, in some embodiments. For example, instructions to program or otherwise generate a DMA operation may be directed to DMA engine 116. Interconnect 130 may also facilitate various communication between access device components, such as operations by a microcontroller (MCU) for an access channel 160, such as MCU 180a or 180b, to allocate or map physical address or storage locations in non-volatile memor(ies) in a page table maintained in management memor(ies) 152 via management memory controller(s) 150. Interconnect 130 may be one of various different kinds of bus architectures, such as Advanced extensible Interface (AXI).

As discussed in more detail below with regard to FIGS. 4A-5, instructions to cause access requests may be dispatched to the access channel according to the storage location or address initially included in the instruction. In some embodiments, address scrambling 120 may be implemented between host interfaces and access channels. Address scrambling 120 may distribute or randomize access to non-volatile memor(ies) in order to disguise access patterns (e.g., prevent reads of sequential locations in memory) in order to prevent malicious actors from discovering the location of different types of sensitive data within non-volatile memor(ies) 172 based on the access patterns. Address scrambling 120 may implement an engine and scrambling muxes (not illustrated), in some embodiments, in order to apply address scrambling for incoming access requests at each host interface 112 or 114. Address scrambling 120 may be programmable in order to apply scrambling for access requests received from specific resources and/or to all access requests, in some embodiments. Address scrambling 120 may obtain random numbers directly from random number generator 140 (e.g., via the direct communication link illustrated in FIG. 1), so that different virtual machines may not use the same scrambling applied to their accesses (to prevent scrambling from being detectable based on a common scrambling pattern). In this way, the scrambling technique may not be predicted or discerned by intercepting the random number if it were determined or transmitted indirectly by other components that could be compromised such as MCU 180. In some embodiments, however, address scrambling 120 may not be implemented.

Requests to read or write to a storage location in non-volatile memor(ies) 172 may be dispatched to the appropriate access channel 160. For example, all of non-volatile memor(ies) 172 may be considered as one large address space, in some embodiments, and thus each access channel 160 may be responsible for accessing a range or portion of that larger address space (which may correspond to the non-volatile memor(ies) 172 that are physically accessible to that access channel 160. A read or write request (to carry out an instruction to access a storage location) may be directed to the translation lookaside buffer corresponding to the access channel responsible for that storage location. For example, access requests to a storage location assigned to access channel 160a may be directed to TLB 162a and access requests to a storage location assigned to access channel 160b may be directed to TLB 162b. TLB 162 may be implemented in order to provide memory mapping between an input storage location (e.g., address) and a translated or physical storage location at one of non-volatile memor(ies) 172. TLB 162 may be implemented as part of or as an MMU specific to an access channel 160, in various embodiments. Because space in TLB 162 may be limited, a larger page table may be stored in a management memory 152 and may be accessed in the event of a miss (or other failure to find a mapping for an input storage location) via management memory controller(s) 150.

Once the translated or physical storage location is determined, the read or write request may be updated or otherwise modified to be directed to that translated or physical storage location and provided directly to the memory controller (MC) of the respective access channel 160 (e.g., MC 170a for access channel 160a or MC 170b for access channel 160b), in various embodiments. In this way, access requests may be performed by MC 170 as hardware operations without any intervention or direction from MCU 180 (which may rely upon firmware to determine how to perform operations). MC 170 may perform read and write commands via physical interfaces to non-volatile memor(ies) 172 in response to requests received from host processors. MC 170 may receive the results of the commands and provide data in response to reads back via interconnect 130 and a host interface to a host processor. MC 170 may provide indications of successful or failing writes to MCU 180, in some embodiments.

MC 170 may be implemented as a hardware controller for performing writes, reads, and other operations to provide access to non-volatile memor(ies) 172 without MCU 180, as noted above. In this way, the performance characteristics of the hardware controller for processing access requests may be fully leveraged, allowing other management operations for non-volatile memories to be handled in MCU 180, which may implement a processor and firmware/software as discussed in detail below with regard to FIG. 2, to handle complex decision-making without introducing the latency that may be incurred with such capabilities into the read/write path for access requests. Moreover, as TLB 162 is in the path or pipeline of access requests as they are passed or directed to MC 170, memory mapping may be performed in a similar fashion without MCU 180.

As discussed in more detail below with regard to FIG. 2, MCU 180 may perform various management operations, including the management of migrations or failed writes to non-volatile memor(ies) 172, without the burden of performing read and write requests from a host processor to non-volatile memor(ies) 172, in some embodiments. For example, wear-leveling schemes may be implemented to select different storage locations (e.g., pages, blocks, bytes, etc.) within non-volatile memor(ies) 172 for migration in order to distribute writes evenly across storage locations and prolong the usable life of a storage location. In some embodiments, MCU 170 may assist MC 180 in performing migrations in response to failed write requests, by selecting a different storage location in non-volatile memor(ies) 172 to receive the write. For such migration events, MCU 180 may provide instructions or requests to perform writes to move the data to the different storage location to MC 170, in various embodiments.

Non-volatile memor(ies) 172 may be various kinds of persistent memory storage that can be byte addressable and/or block addressable. Non-volatile memories may include flash-based memory technologies such as NAND or NOR flash memory. In at least some embodiments, non-volatile memor(ies) 172 may include storage class memory, which may include non-volatile memory technologies such as resistive random access memory (ReRAM), phase-change memory (PCM), or conductive-bridging random access memory (CBRAM), which may allow for larger storage capacity with lower cost than volatile memory technologies, such as static random access memory (SRAM) or dynamic random access memory (DRAM), and with faster access times/speeds than block-based persistent storage (e.g., such as hard disk drives) or flash-based memory technologies, like NAND).

Access device 102 may implement random number generator 140, in some embodiments. For example, random number generator 140 may generate random numbers for encryption keys and for address scrambling, as discussed in detail below. In some embodiments, random number generator 140 may implement an interface for configuration. In this way, a wrapper can be created around random number generator 140 in order to allow multiple components that are directly connected to random number generator 140 (e.g., MCs 170a and 170b and components of address scrambling 120) to share the random number generator 140 and to have direct interfaces (request/acknowledge) to random number generator 140 to receive generated random numbers, in some embodiments.

Access device 102 may have access to (or include as a component on the same chip or card) memory to support management operations of access device, such as management memor(ies) 152. For example, management memor(ies) may include a flash-based persistent memory to store firmware for a MCU or in the event that access device 102 is implemented as an FPGA, the code or configuration to implement the FPGA of access device 102, in some embodiments. A corresponding flash controller may be implemented as a memory management controller 150 in order to provide access to the flash-based persistent memory. In some embodiments, management memor(ies) 152 may include a volatile memory for providing quick access to information for performing memory mapping (e.g., a dynamic random access memory (DRAM) component), such as a page table as is discussed in more detail below with regard to FIG. 4B. Correspondingly, a management memory controller 150 may be a volatile memory controller (e.g., a DRAM controller) to provide access to the memory mapping information in the management memory 150.

A host processor, such as discussed below with regard to FIGS. 9A-10, may be implemented as part of a host to implement various computing resources, such as virtual computing resources (e.g., a hypervisor offering access to one or more droplets, instances, or other resources operating within the virtual environment offered, operating systems, applications or other hosted resources), in some embodiments. A host processor may be implemented as part of a computing system, like computing system 1000 discussed below with regard to FIG. 10, or other computing server, node, or device that provides the resources utilizing or executing upon host processor with access to the storage offered by non-volatile memor(ies) 172, according to various configurations, such as the configurations illustrated in FIGS. 9A and 9B, in some embodiments.

Figure 10:
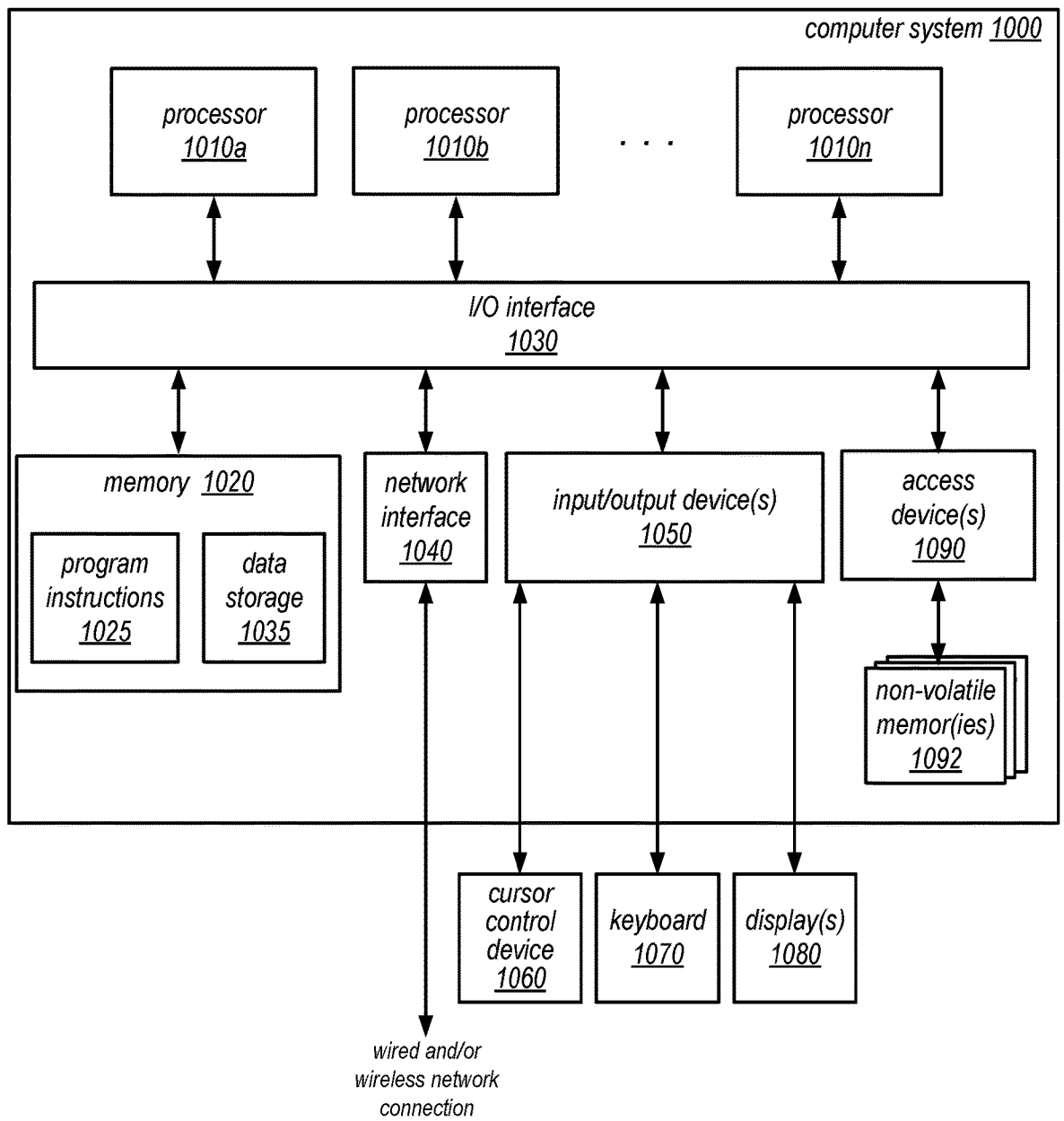
FIG. 10 is an example computer system, according to some embodiments.

A host processor may implement resources that utilize non-volatile memor(ies) 172 to provide various storage configurations, operations, or improvements, including, but not limited to byte addressable access to read/write to a cacheable memory (which may be different than, and thus may have a higher latency than volatile memory devices, such as system memory 1020 in FIG. 10), optimizations for virtualizations platforms (e.g., allowing a hypervisor for virtual compute instances to move data directly using a direct memory access interface between system memory and non-volatile memor(ies), persistent memory storage, or memory mapped access to a file (e.g., using "mmap" or Linux Direct Access (DAX)), or block addressable storage access to provide faster caching of pages (by transferring data from block-based storage devices, like hard disk drives, to non-volatile memory 172 for faster access to the host processor and possible fast transfer using techniques like Direct Memory Access (DMA) to move data into system memory) or as fast block storage, among other examples in some embodiments.

Please note that the previous description of access device 102, interface(s) 112 and 114, DMA engine 116, shared virtual memory protection mapping 118, interconnect 130, access channels 160a and 160b, including TLBs 162a and 162b, MCs 170a and 170b and MCUs 180a and 180b respectively, non-volatile memor(ies) 172a and 172b, random number generator 140, management memory controller(s) 150 and management memor(ies) 150 are merely provided as an examples of memory mapping in an access device for directing memory controller access to a non-volatile memory. Different numbers of components or configuration of components may be implemented. For example, multiple host processors may connect to a single access device or multiple access devices that provide separate access channels to different groups of non-volatile memories to one or more host processors may be implemented.

This specification begins with general descriptions of a microcontroller, which may direct management operations, and of a memory controller which may perform access requests according to a memory mapping implemented to direct the memory controller. Various examples of different components/modules, or arrangements of components/modules that may be implemented in the microcontroller and memory controller may then be discussed. A number of different methods and techniques to implement memory mapping in an access device for directing memory controller access to a non-volatile memory are then discussed, some of which are illustrated in accompanying flowcharts. Various examples are provided throughout the specification.

Figure 2:
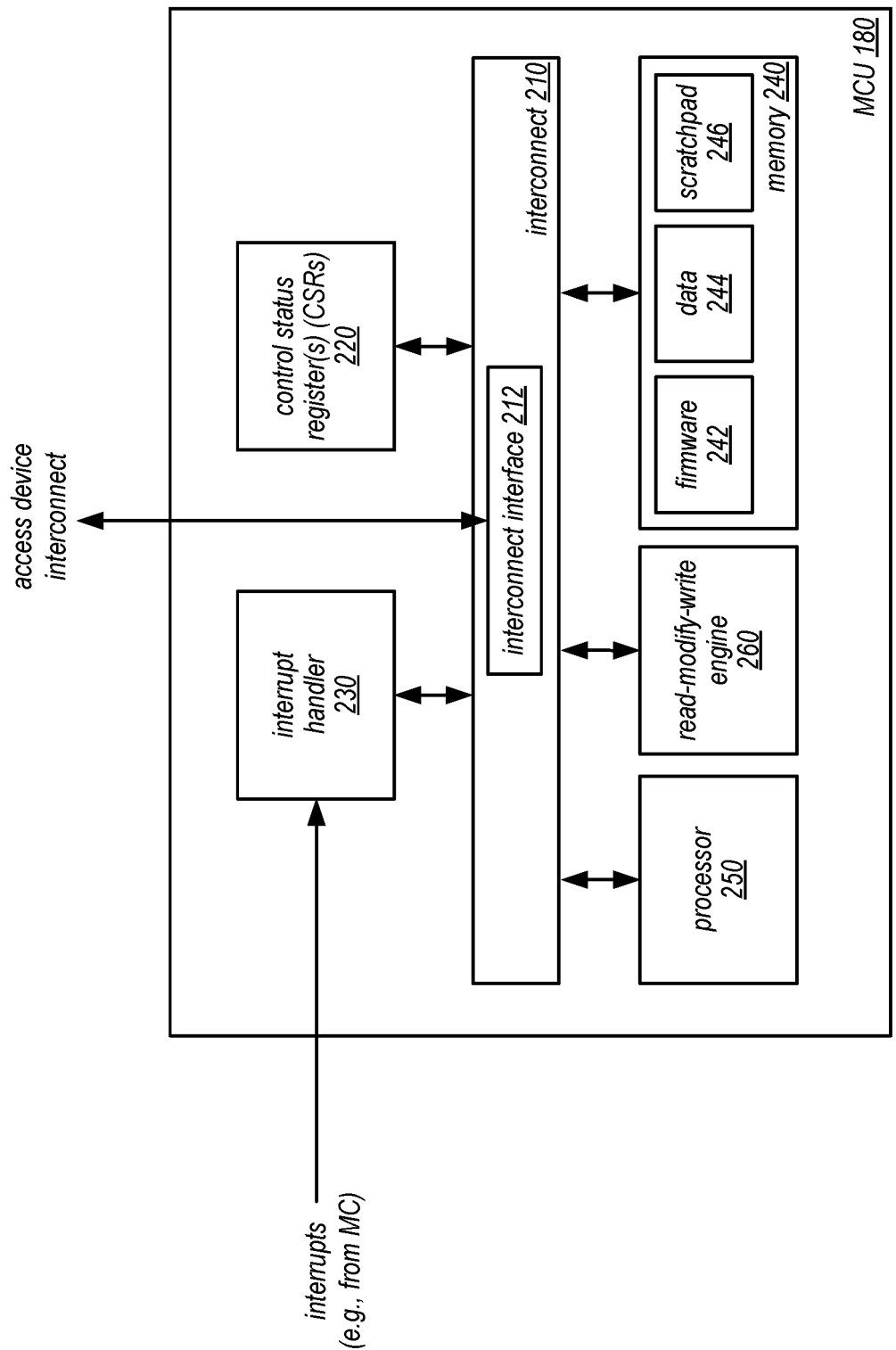
FIG. 2 is a logical block diagram illustrating a microcontroller of an access device for a non-volatile memory, according to some embodiments.

FIG. 2 is a logical block diagram illustrating a microcontroller of an access device for a non-volatile memory, according to some embodiments. MCU 180 may implement interconnect 210. Similar to interconnect 130 discussed above with regard to FIG. 1, interconnect 210 may implement one of many different kinds of bus architectures, such as an AXI fabric. Interconnect 210 may also implement interconnect interface 212, which may include the various components to act as slave, master, or other role for communicating with the access device interconnect 130, in some embodiments.

In some embodiments, MCU 180 may implement interrupt handler 230. Interrupt handler 230 may receive interrupt signals from various access device components, such as MC 170, which may indicate various conditions, scenarios, or other information. For example, an interrupt may be received to indicate that a write operation failed to complete successfully at MC 170, which may trigger a migration event to be managed by MCU 120. Similarly, MCU 180 may implement control status register(s) (CSRs) 220 for communicating various information with other components of access device 102 (e.g., MC 170) or within MCU 180 (e.g., read-modify-write engine 260), in some embodiments.

In some embodiments, MCU 180 may implement processor 250. Processor 250 may execute or perform firmware 242 (or other software) in memory 240, access data 244 as part of the performance of firmware 242, and/or load different instructions or data from scratchpad 246. In some embodiments, firmware 242, data 244, and scratchpad may be implemented on individual memory components 240 (which may be various kinds of volatile or non-volatile memory devices). Firmware 242 may include instructions to perform various management operations. For example, migration event may be implemented as part of firmware 242 (e.g., including instructions to implement wear-leveling schemes and destination location selection for failed writes). Read-modify-write engine 260 may be implemented in various embodiments, to allow MCU 180 to support load store operations of different sizes (e.g., allowing the MCU to support a 64 byte load/store from non-volatile memory).

Figure 3:
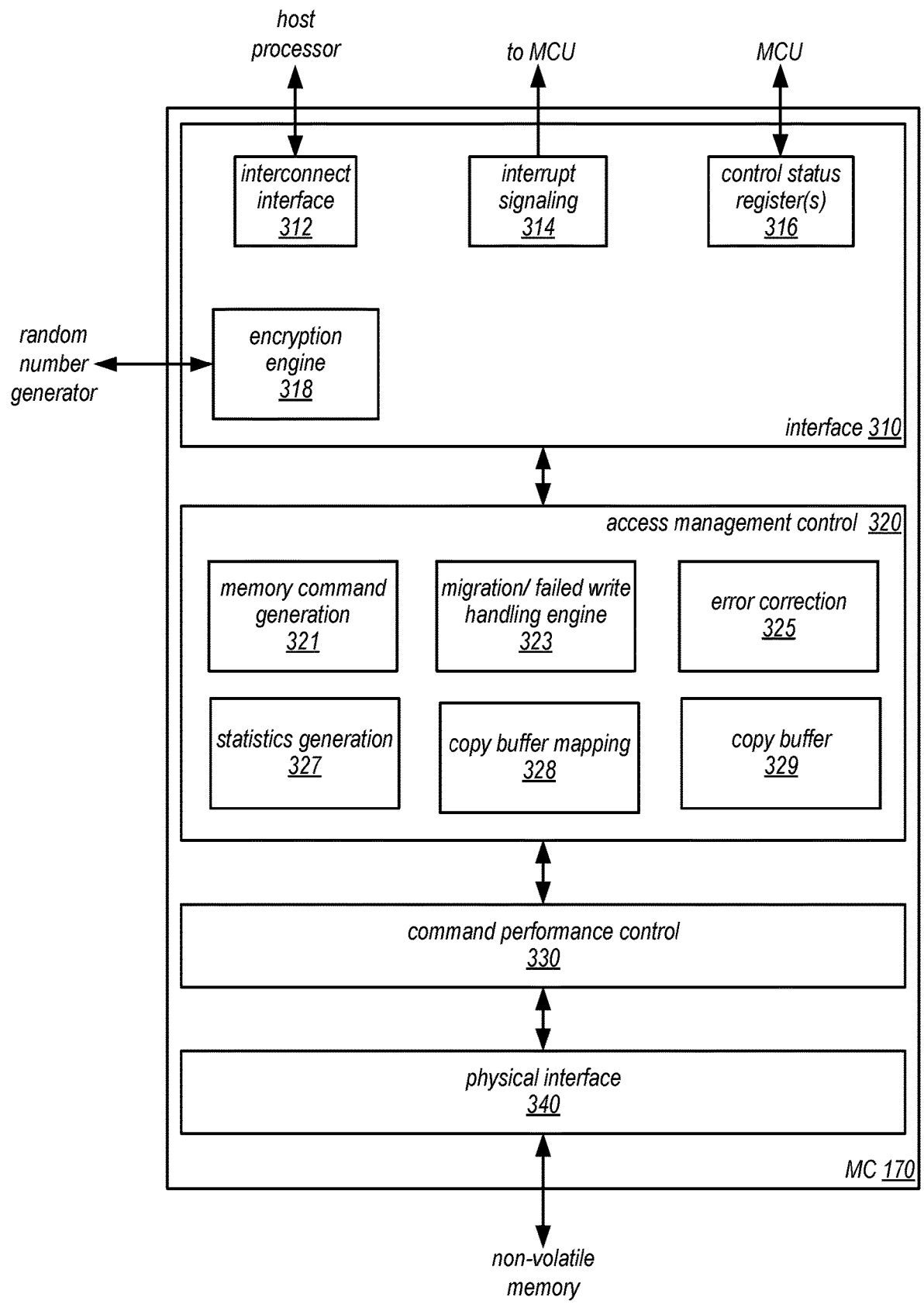
FIG. 3 is a logical block diagram illustrating a memory controller of an access device for a non-volatile memory, according to some embodiments.

FIG. 3 is a logical block diagram illustrating a memory controller for a non-volatile memory, according to some embodiments. Memory controller 170 may be a hardware controller for non-volatile memory, in various embodiments. Memory controller may implement interface 310 to facilitate different interactions with MC 170. For example, interface 310 may implement interrupt signaling 314 to generate and send interrupt signals from MC 170 to MCU 180, such as interrupts signaling a failed write at MC 170. Interface 310 may implement control status register(s) (CSRs) 314 which may communicate various information to MCU 180. For example, CSRs may include, but are not limited to the copy buffer assignment CSR, copy buffer status CSR, a migration allocation limit CSR, migration destination CSR, migration done CSR, migration status CSR, address translation clear CSR, and failed write status CSR. Different components of MC 170, such as failed write engine 327, may write to or obtain data from CSRs 314 to perform various operations.

Interface 310 may implement interconnect interface 312, in various embodiments, to handle access requests (read or write requests) received from a TLB, such as TLB 162 in FIG. 1 or from MCU 180, in some embodiments. For example, interconnect interface 312 may implement request and data buffers for reads and writes as well as arbitration components for providing access to them (e.g., using a round-robin access distribution scheme). Interconnect interface 312 may implement transaction or request selection ordering and/or reordering control logic to initiate the generation of memory commands to be performed, in some embodiments. Interconnect interface 312 may implement response control logic for handling responses to access requests received from command performance control, as well as for write responses, in some embodiments.

In some embodiments, interface 310 may implement encryption engine 318. Encryption engine 318 may generate and retain encryption keys based on a random number received directly from random number generator 140. As discussed in detail below with regard to FIGS. 6 and 8, encryption engine 318 may encrypt or decrypt data for computing resources according to an encryption key for the identity of the resource that submitted the access request (e.g., virtual instances may be assigned separate identifiers linked to different encryption keys).

MC 130 may implement access management control 320 to perform high-level control operations for interacting with non-volatile memory, in various embodiments. For example, read/write requests that are received from TLB 162 may initiate the generation of a command at memory command generation 321. In some embodiments, access management control may implement a copy buffer 329 to store data that is being migrated or previously failed to write. Thus, when a write or read request for storage location is received, a determination may be made as to whether the desired data indicated in the read or write request is located in the copy buffer 329 or is in the specified location in non-volatile memory. For example, a lookup table or other copy buffer mapping 328 may be implemented in a content addressable memory (CAM) type of memory that indicates whether the data of a storage location indicated in the read or write request is located in copy buffer 329 (and what portion of copy buffer 329 stores the data). Thus in scenarios where the read/write storage location is directed to a storage location that may have changed (e.g., due to a failed write or wear-leveling migration), subsequent reads or writes to the storage location may be temporarily directed to copy buffer 329. In some embodiments, copy buffer mapping 328 may identify a new storage location in non-volatile memory, which may be the resulting location after the performance of a migration (or a write to new location following a failed write to another storage location) for which TLB 162 has not been updated to identify. In this way, reads and writes may continue while migration is being performed, so that a migration operation does not block access to a storage location during the migration.

Copy buffer mapping 328 may be implemented as a table, in some embodiments, with fields indicating whether an entry in the table is valid, source storage location (which may be the original location of the page, block being migrated), destination storage location (which can be an address in non-volatile memory or copy buffer 329), and type of destination storage location (e.g., copy buffer 329 or non-volatile memory location). New entries may be added to copy buffer mapping 328 (e.g., by failed write/migration engine 323) when a migration is performed for a storage location or an attempt to write the storage location failed. When a migration has been successfully performed to non-volatile memory or a successful write to a different location (for a failed write), copy buffer mapping 328 may be updated by migration/failed write handling engine. The update may change the source location and the destination location for the migration and the type field may be cleared, in some embodiments. In this way, if a request for the source storage location is received, copy buffer mapping 328 may direct the request to the destination location in non-volatile memory. Once an update to a TLB 162 is performed to map the source storage location to the destination storage location, migration/failed write handling engine 323 may delete the entry in copy buffer mapping 328 for the source storage location, in some embodiments.

Memory command generation 321 may generate the non-volatile memory command for read or write requests if the storage location (e.g. identified by TLB 162 or copy buffer mapping 328) is in non-volatile memory or may generate/perform commands to write/read an identified location or entry in copy buffer 329, in some embodiments.

Copy buffer 329 may be implemented, in various embodiments, to store data undergoing migration from one storage location to another. In this way, the data can still be accessible to writes or reads directed to the data (even though the data may not be in the location originally specified in the read/write request. Copy buffer 329 may be divided into blocks or other sub-sections that provide storage for individual data. The number of blocks, and thus the number of ongoing migrations may be limited in some embodiments according to a limit described in a migration allocation limit CSR (which may be programmed by MCU 180). In some embodiments, each block of copy buffer 329 may include metadata that describes whether a block is free or in use, the source location of data stored in the block, the destination location of the data stored in the block, and the status of the operation to move the data block (e.g., success or fail), in some embodiments. The block may include a valid field and a dirty field (e.g., indicating that the data has changed from when it was first read, sent or obtained), which may indicate whether the data in copy buffer block should be returned for a read request. A copy buffer block may be allocated or written to by migration/failed write handling engine 323, in some embodiments, in order to store data for a detected write failure.

Successful reads to copy buffer 329 may return results from copy buffer 325 via interconnect interface 312, in some embodiments. If encryption is being applied, then the results may first pass through encryption engine 318 to be decrypted according to an encryption key identified for the access request. Similarly, data from successful reads to non-volatile storage may be returned via interconnect interface 312, in some embodiments. Likewise, if encryption is being applied, then the results may first pass through encryption engine 318 to be decrypted according to an encryption key identified for the access request. For successful writes to copy buffer, the block description information may be set with the valid and dirty fields to "1" to indicate that the data is valid and that the data is different from the data that is stored non-volatile memory.

Migration/failed write handling engine 323 may perform operations to handle failed writes and/or writes to perform a migration (e.g., for wear leveling selections made by MCU 180). For example, migration/failed write handling engine 323 may poll for or otherwise obtain error or status information for a write operation (e.g., by sending a command to read an error mode register for a location in non-volatile memory to determine whether the write failed or succeeded). Migration/failed write handling engine 323 may signal interrupts of failed writes via interrupt signaling 314 to MCU 180. Migration/failed write handling engine 323 may write a copy of the data to be migrated to copy buffer 329 (as well as perform other copy buffer block description initialization to description fields). Migration/failed write handling engine 323 may update or delete entries from copy buffer mapping 328 as new failed writes are detected (or writes performed for other migration events).

Migration/failed write handling engine 323 may read or write to different control status registers to perform writes for migration events indicated by MCU 180 via control status registers (e.g., wear-leveling selections). In some embodiments, migration/failed write handling engine 323 may perform operations in response to values or information received via a CSR. For example, for migration events triggered at MCU 180 to perform wear leveling, failed write engine may detect a write or change to a copy buffer assignment CSR. The write to the copy buffer assignment CSR may act as a request from the MCU 180 to obtain a copy buffer entry in order to perform a migration for wear leveling. Migration/failed write handling engine 323 may check whether an entry in copy buffer 329 is available to store data for a migration. If there is no free entry, then migration/failed write handling engine 323 may write a copy buffer status CSR to indicate that copy buffer assignment for the MCU 180 failed. If there is a free copy buffer entry, then migration/failed write handling engine 323 may determine whether an entry in copy buffer mapping 328 is free. If there is no free entry in copy buffer mapping 328, then migration/failed write handling engine 323 may write a copy buffer status CSR to indicate that copy buffer assignment for the MCU 180 failed (as an entry in copy buffer mapping 328 would be used to redirect reads and writes to the copy buffer entry if used). If an entry in copy buffer mapping 328 is free (in addition to a copy buffer entry), then migration/failed write handling engine 323 may write a migration source location to the free entry in the translation buffer, data from the source location into the free entry of the copy buffer, and a destination location to point to the free entry in the copy buffer. Then, migration/failed write handling engine 323 may update a copy buffer status CSR to indicate that the copy buffer assignment request (indicated by copy buffer assignment CSR) was successful and provide the location of the free entry in the copy buffer (e.g., an entry number, slot, etc.). In another example of a CSR that triggers an action performed by migration/failed write handling engine 323, a write to a migration destination CSR may identify an entry in the copy buffer 329 to write a destination address selected by MCU 180.

Another example of a CSR that triggers an action performed by migration/failed write handling engine 323 is a write to a migration done CSR. Migration/failed write handling engine 323 may check to see if the operation to write the data failed (e.g., in the migration operation status field) in the block description for the copy buffer entry identified in the migration done CSR. If a failure is indicated then, migration/failed write handling engine 323 may write a migration failure indication in migration status CSR and clear the migration status field to indicate no failure (e.g., set to "0") in the copy buffer entry. If the operation to write the data did not fail, then migration/failed write handling engine 323 may check to see if a dirty field is set for the entry. If yes, then migration/failed write handling engine 323 may set migration failed to indicate a dirty value in migration status CSR and clear the migration status field to indicate no failure (e.g., set to "0") in the copy buffer entry. If no operation failure or dirty data is indicated, then migration/failed write handling engine 323 may indicate in a write to migration done status CSR that the migration succeeded. In another example of a CSR that triggers an action performed by migration/failed write handling engine 323 is a write to an copy buffer mapping clear CSR. Migration/failed write handling engine 323 may locate an entry in copy buffer mapping 328 with a source location and failed write location for the identified migration and clear the entry.

In some embodiments, access management control 320 may implement error correction techniques 325 to identify and, in some scenarios, correct errors in data stored in non-volatile memory. For example, error correction 325 may implement forward error correction techniques, such as Reed-Solomon error detection and correction, to add detection symbols or other information to data when it is stored so that when data is returned in response to an access request errors can be detected and corrected (e.g., up to twelve 8-bit symbols). In some embodiments, error correction 325 may perform scrubbing operations for storage locations in non-volatile memory in response to requests to perform scrubbing received from MCU 180.

In some embodiments, access control management 320 may implement statistics generation 327 to support the collection of various statistics for access device 102. For example, statistics generation 327 may collect or determine write counts for storage locations which may be used to perform wear-leveling and other management operations, in some embodiments. Other metrics indicating, for example, access channel utilization or access latency may be similarly collected or generated, in some embodiments.

MC 170 may implement command performance control 330 in various embodiments, to provide low-level control functions and logic for processing access requests to non-volatile memory. For example, command performance control 330 may converts commands received from access management control 320 into the signaling that conforms to the specification of the non-volatile memory which may be transmitted via physical interface 340 to non-volatile memory. Command performance control 330 may enforce timing specifications at physical interface 340. For instance, command performance control 330 may synchronize or otherwise operation according to a non-volatile memory clock frequency (which may be also synchronous with a main clock for MC 170), in some embodiments. Command performance control 330 may perform memory training and initialization operations, in some embodiments. MC 170 may implement physical interface 340 to provide the physical connection to non-volatile memory via which requests and results/errors may be received.

Figure 4A:
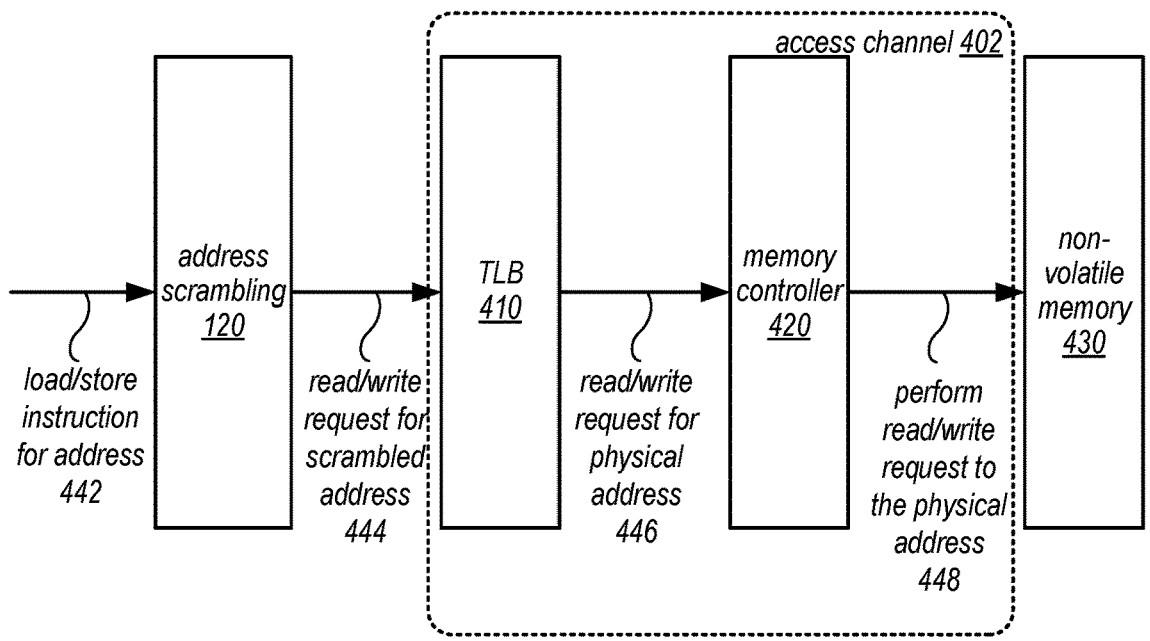
FIGS. 4A-4B are logical block diagrams illustrating load or store instruction processing at an access device that implements memory mapping for directing memory controller access to a non-volatile memory, according to some embodiments.
Figure 4B:
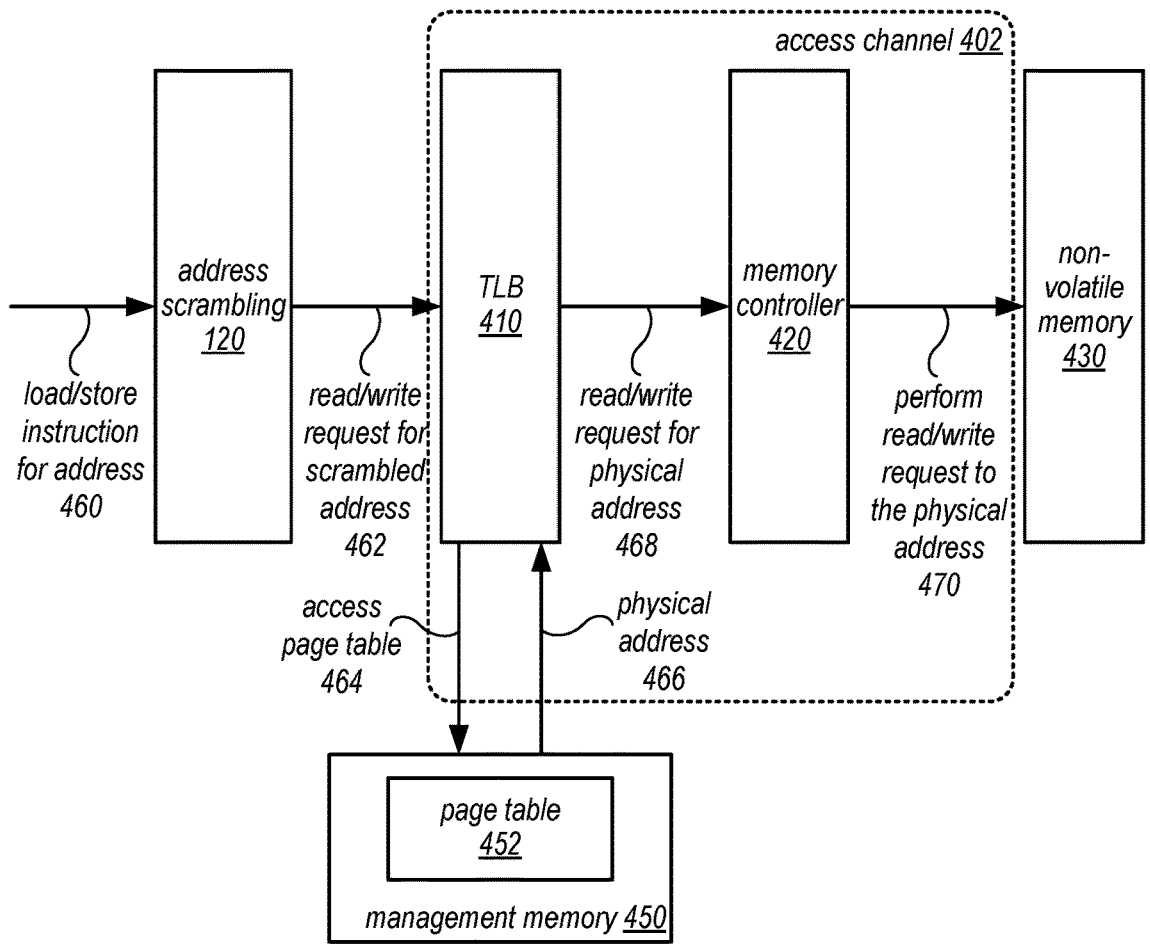

FIGS. 4A and 4B are logical block diagrams illustrating load or store instruction processing at an access device the implements memory mapping for directing memory controller access to a non-volatile memory, according to some embodiments. In FIG. 4A, a load or store instruction 442 for a host processor may be received. The load or store instruction may specify a storage location, such as an address to access. If address scrambling is enabled, address scrambling 120 may swizzle or otherwise modify address bits to determine a scrambled address for the access request. Some address scrambling may be performed for specific host resources (e.g., for identified virtual machines), in some embodiments. Address scrambling may be applied to all access requests (e.g., an addition to resource-specific scrambling), in some embodiments, in order to disguise access patterns. A read or write request for the scrambled address 444 may be directed to or next processed at TLB 410. TLB 410, similar to TLB 162 in FIG. 1, may be a TLB of the access channel 402 to which the scrambled address has been assigned. A matching entry (e.g., a hit) for the scrambled address may be identified at TLB 410, indicating a physical address to replace the scrambled address in the read or write request. The read or write request may be modified, replacing the scrambled address with the physical address and sent 446 to memory controller 420. Memory controller 420 may be similar to memory controller 170 discussed above and may be the memory controller of access channel 402. As discussed above, memory controller 420 may generate command and perform the read or write to the physical address 448 in non-volatile memory 430. As discussed above, if the read or write request is encrypted (using an encryption key from an encryption engine like encryption engine 318), then the data to be written may be encrypted, in some embodiments.

Not all addresses may be present in TLB 410 at any given time. FIG. 4B illustrates a scenario when TLB 410 does not have a matching entry for a scrambled address. A load or store instruction 460 for a host processor may be received. The load or store instruction may specify a storage location, such as an address to access. If address scrambling is enabled, address scrambling 120 may swizzle or otherwise modify address bits to determine a scrambled address for the access request. A read or write request for the scrambled address 462 may be directed to or next processed at TLB 410. No matching entry (e.g., a miss) for the scrambled address may be identified at TLB 410, therefore, TLB 410 may initiate access 464 to perform a page table walk, scan or other evaluation of page table 452 in management memory 450 via a memory controller for management memory 450 (which may be similar to management memor(ies) 152 and management memory controller 150 in FIG. 1.). Once a matching mapping is identified, then the physical address 466 may be returned to TLB 410. An entry may be added (or other entry replaced with) the mapping between the scrambled address of 462 to the obtained physical address 466. The read or write request may be modified, replacing the scrambled address with the physical address and sent 468 to memory controller 420. As discussed above, memory controller 420 may generate command and perform 470 the read or write to the physical address in non-volatile memory 430.

Figure 5:
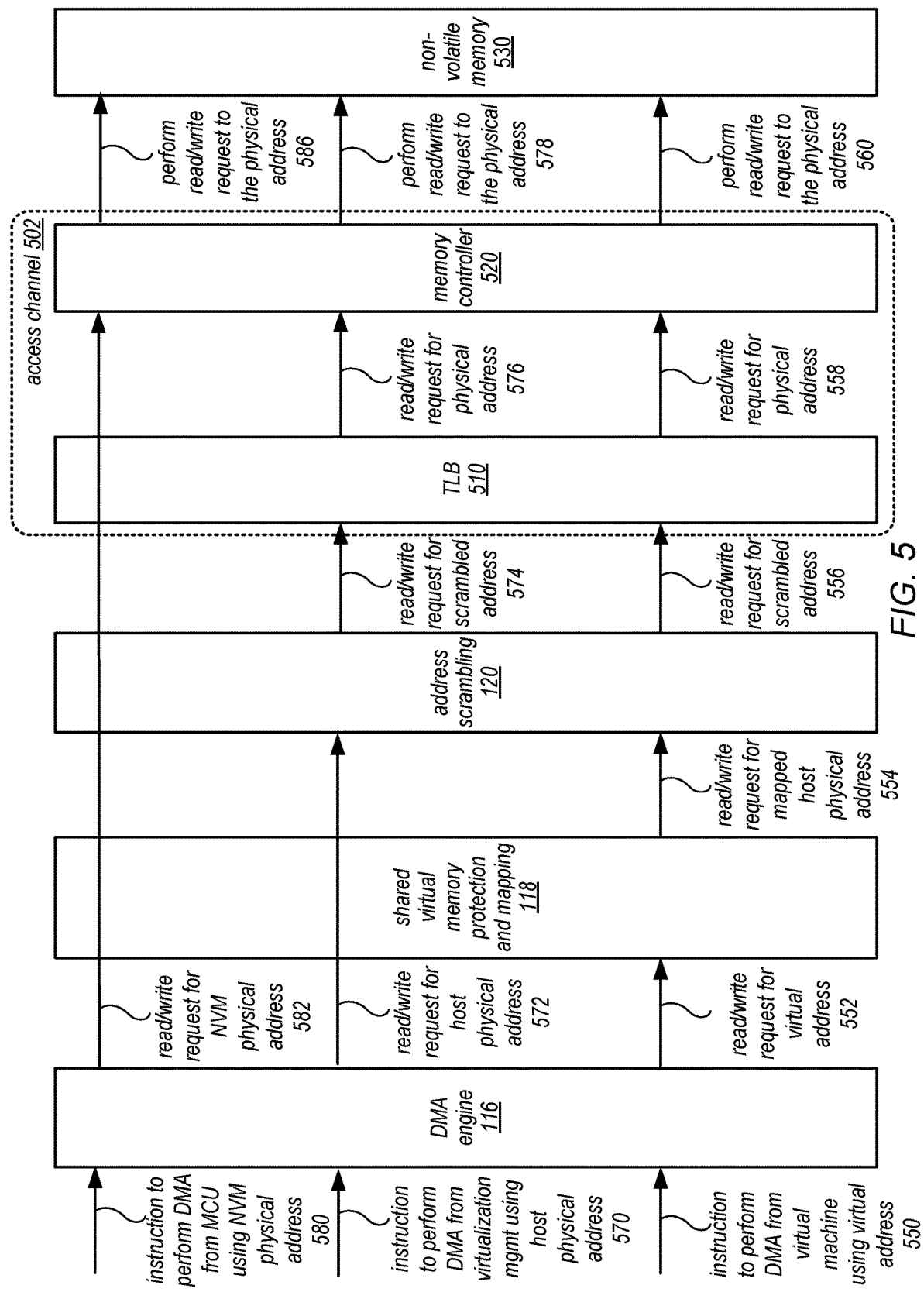
FIG. 5 is a logical block diagram illustrating direct memory access (DMA) processing at an access device the implements memory mapping for directing memory controller access to a non-volatile memory, according to some embodiments.

FIG. 5 is a logical block diagram illustrating direct memory access (DMA) processing at an access device the implements memory mapping for directing memory controller access to a non-volatile memory, according to some embodiments. DMA requests may be generated from different sources. For example, an instruction to perform DMA to copy data from the non-volatile memory to a host memory or receive and store data from a host memory in the non-volatile memory may be received from a virtual machine on the host, as indicated at 550, which may indicate a virtual address for the DMA operation. DMA engine 116 may be configured to perform the access request and prepare the appropriate read or write request to non-volatile memory 530. The read or write request for the virtual address 552 may be provided to shared virtual memory protection and mapping 118. Shared virtual memory mapping and protection 118 may identify the virtual machine associated with the DMA request 550 and prevent that DMA request from supplying a virtual address (or causing an access thereof) that is allocated to another virtual resource or virtualization management. Address bits may be used to identify the user of DMA engine (e.g., virtualization resource, virtualization management, or other components such as an MCU 180).

A read or write request for a mapped host physical address may then be provided 554 to address scrambling (if enabled). If address scrambling is enabled, address scrambling 120 may swizzle or otherwise modify address bits to determine a scrambled address for the read or write request. As discussed above, some address scrambling may be performed for specific host resources (e.g., for identified virtual machines), in some embodiments. Address scrambling may be applied to all access requests (e.g., an addition to resource-specific scrambling), in some embodiments, in order to disguise access patterns. A read or write request for the scrambled address 556 may be directed to or next processed at TLB 510. TLB 510, similar to TLB 162 in FIG. 1, may be a TLB of the access channel 502 to which the scrambled address has been assigned. A matching entry (e.g., a hit) for the scrambled address may be identified at TLB 510, indicating a physical address to replace the scrambled address in the read or write request. If no matching entry is found, then as described above with regard to FIG. 4B, a page table may be accessed to identify the matching address. The read or write request may be modified, replacing the scrambled address with the physical address and sent 558 to memory controller 520. Memory controller 520 may be similar to memory controller 170 discussed above and may be the memory controller of access channel 502. As discussed above, memory controller 520 may generate command and perform 560 the read or write to the physical address in non-volatile memory 530. As discussed above, if the read or write request is encrypted (using an encryption key from an encryption engine like encryption engine 318), then the data to be written may be encrypted, in some embodiments.

Another example of an instruction to perform DMA may be received from a virtualization management platform (e.g., a hypervisor), as indicated at 570. The DMA request from the virtualization management platform may include or indicate a host physical address, which may perform DMA operations to read or write for the indicated host physical address that by-pass mapping at 118 in order to move data from system memory to non-volatile memory (e.g., moving virtual machine instance data from system memory to non-volatile memory when the instance is inactive). Subsequent features, such as address scrambling 120 may be applied to the host physical address to use a scrambled address to read or write 574 instead of the host physical address. The scrambled address may then be used in at TLB 510 to lookup and perform a read or write request for a physical address 576 of non-volatile memory 530 (which may be provided to memory controller 520 to perform the read or write request using the physical address 578).

Another example of an instruction to perform DMA may be received from the MCU (e.g., MCU 180 in FIGS. 1 and 2) using a non-volatile memory (NVM) physical address 580. DMA engine 116 may perform a read or write request using the NVM physical address 582 that may be used by memory controller 520 to perform the read or write request to the physical address 586.

Figure 6:
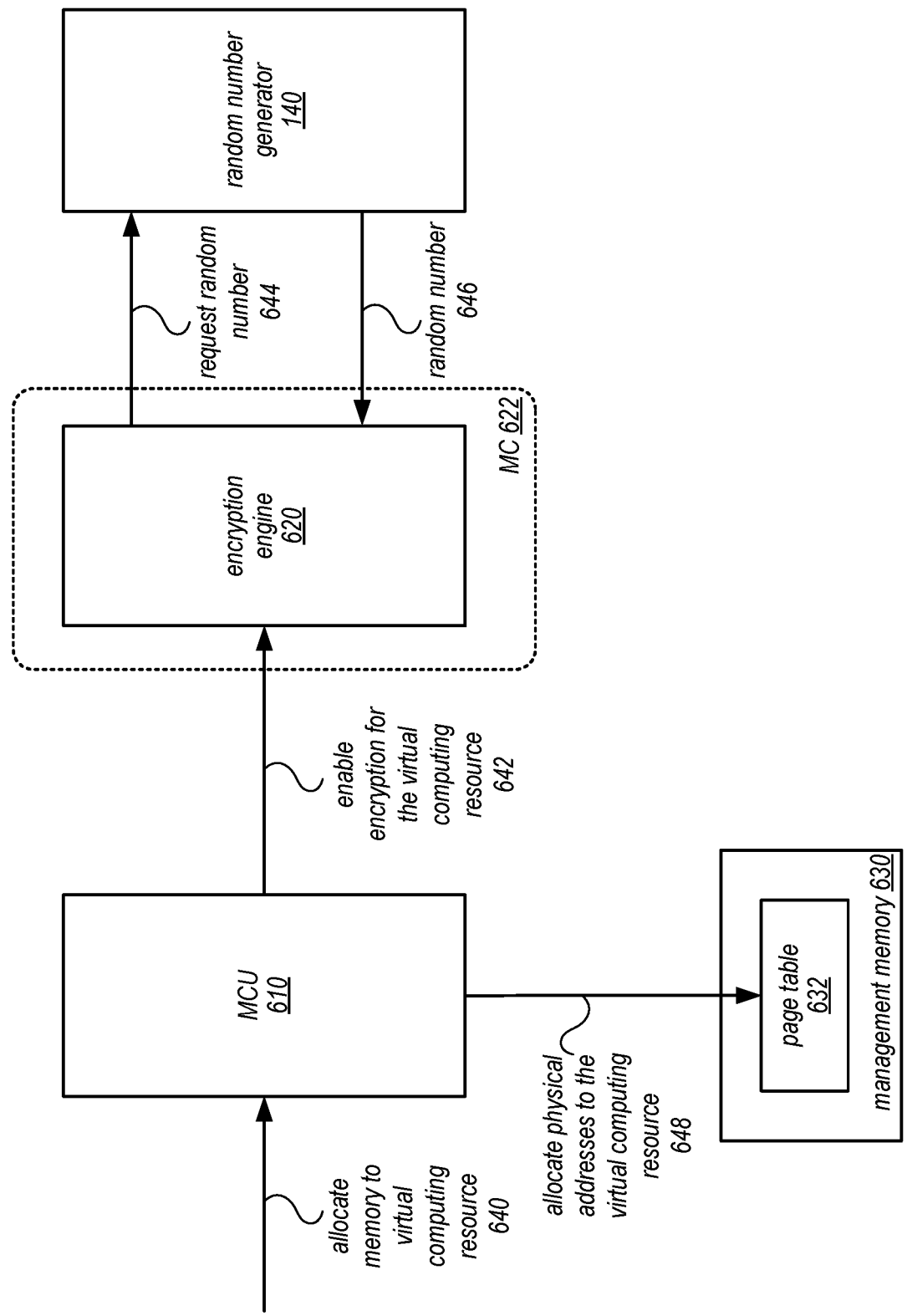
FIG. 6 is a logical block diagram illustrating initializing encryption at an access device for a virtual computing resource as part of allocating memory of the non-volatile memory to the virtual computing resource, according to some embodiments.

Encryption may be implemented within a memory controller providing access to a non-volatile memory so that the data may be stored in an encrypted format. FIG. 6 is a logical block diagram illustrating initializing encryption at an access device for a virtual computing resource as part of allocating memory of the non-volatile memory to the virtual computing resource, according to some embodiments. MCU 610, which may be similar to MCU 180 discussed above with regard to FIGS. 1 and 2, may receive a request to allocate memory to a virtual computing resource 640, in some embodiments. The request may include an identifier or other information for identifying the virtual computing resource. The request may identify an amount or range of memory to allocate to the virtual computing resource. MCU 610 may assign or update page table 632 in management memory 630 (which may be similar to management memor(ies) 152 and management memory controller 150 in FIG. 1) to allocate 648 physical addresses of non-volatile memory to the virtual computing resource that is provided via the access channel of which MCU 610 and MC 622 are implemented within.

MCU 610 may instruct or enable 642 encryption for the virtual computing resource at MC 622, in some embodiments. For example, encryption engine 620, similar to encryption engine 318 discussed above with regard to FIG. 3, may store a mapping or link between the identified virtual computing resource (which may be determined according to an identifier included in the instruction to enable encryption) and an encryption key to be used for encrypting and decrypting data. The encryption key may be generated using various techniques that may rely upon a random number. Encryption engine 620 may use a direct connection (bypassing interconnect 130 and other components) between MC 622 and random number generator 140 to request 644 and obtain a random number 646 to generate the encryption key, in some embodiments.

The examples of memory mapping in an access device for directing memory controller access to a non-volatile memory as discussed above with regard to FIGS. 1-6 have been given in regard to an example access device. Note that various other types or configurations of host devices or systems, access devices, or non-volatile memory may implement an access device that provides an access channel for non-volatile memory and thus may implement these techniques. In addition to examples given above, the techniques discussed below with regard to FIGS. 7 and 8 may be also implemented using the various components discussed above as well as different types of systems or devices that provide access to non-volatile memory.

Figure 7:
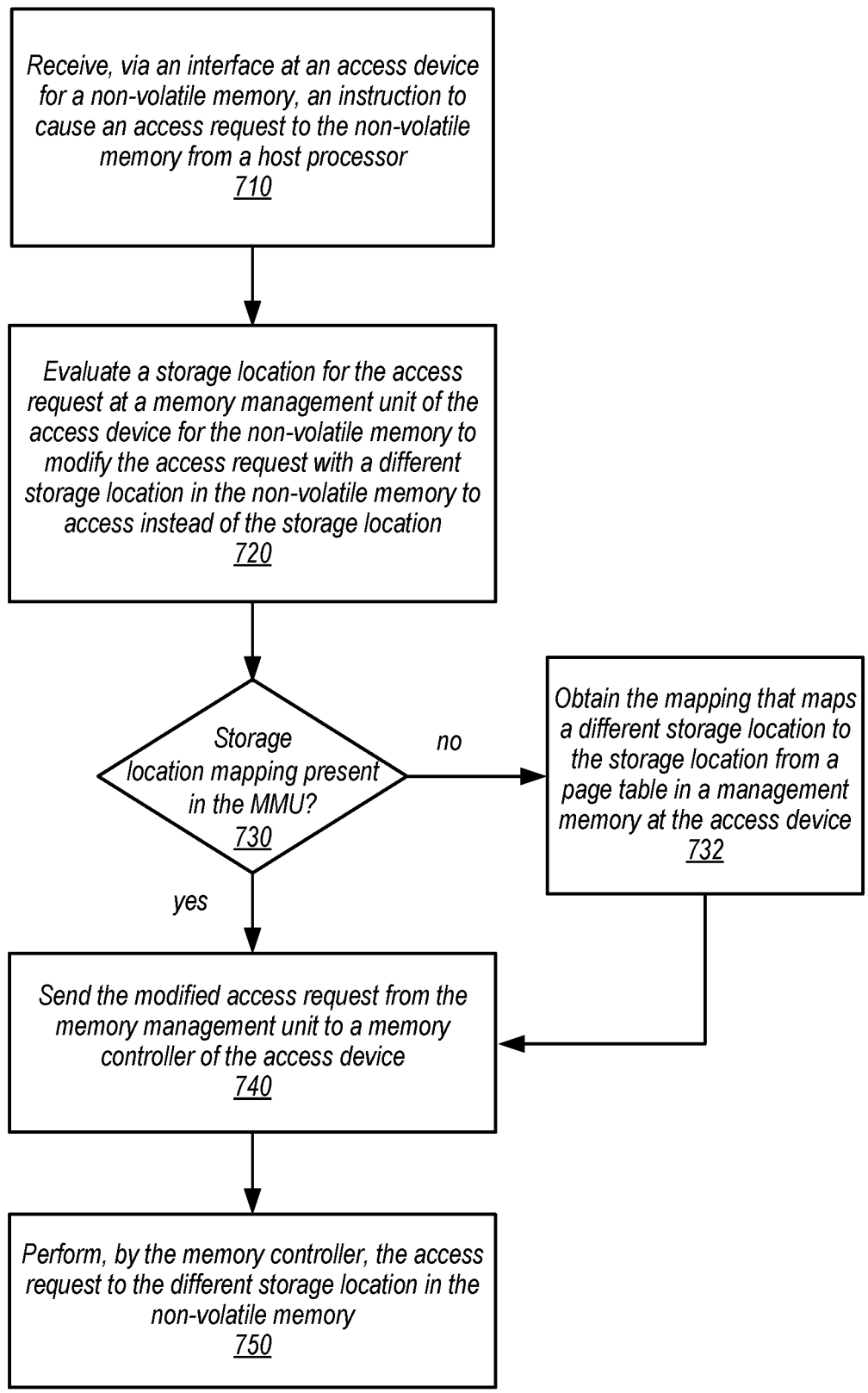
FIG. 7 is a high-level flowchart illustrating various methods and techniques to implement memory mapping in an access device for directing memory controller access to a non-volatile memory, according to some embodiments.

FIG. 7 is a high-level flowchart illustrating various methods and techniques to implement memory mapping in an access device for directing memory controller access to a non-volatile memory, according to some embodiments. As indicated at 710, an instruction to cause an access request to a non-volatile memory may be received via an interface at an access device for the non-volatile memory, in various embodiments. The access request may be received from a host processor, in some embodiments. The instruction may be an instruction to perform a load or store operation to non-volatile memory (e.g., treating non-volatile memory as an extension of system memory), in some embodiments. The instruction may be an instruction to perform a DMA operation, which may cause the generation of a read or write request to copy data from or store data to the non-volatile memory with respect to another memory for the host processor, in some embodiments. The instruction may be a request to perform an I/O operation to access a data block (e.g., according to a block-addressable format, treating non-volatile memory as block-based persistent storage, such as a SCSI formatted I/O request).

As indicated at 720, a storage location (which may be received as part of the initial access request or determined/derived from the storage location, such as a scrambled storage location and/or mapped physical storage location from a virtual storage location for DMA access) may be evaluated at a memory management unit of the access device for the non-volatile memory to modify the access request with a different storage location in the non-volatile memory to access instead of the storage location. For example, as discussed above in FIGS. 1 and 4A-5, a translation lookaside buffer may maintain mapping information for non-volatile memory that may link an input storage location (e.g., address) to physical storage location in the non-volatile memory. As space may be limited, the storage location mapping may not be available in the MMU. As indicated by the negative exit from 730, if the MMU does not include the storage location (e.g., no matching entry), then the mapping that maps the storage location to a different storage location may be obtained from a page table in a management memory at the access device, as indicated at 732, in some embodiments.

As indicated at 740, the modified access request may be sent from the memory management unit to a memory controller of the access device, in various embodiments. In this way, the access request may be performed by the memory controller, bypassing a microcontroller for the non-volatile memory, in some embodiments. As indicated at 750, the access request to the different storage location in the non-volatile memory may be performed by the memory controller, in some embodiments. For example, the memory controller may generate a read or write command to be sent to the non-volatile memory via a physical interface that connects the access device to the non-volatile memory. As multiple non-volatile memory devices may be connected to the access device, the memory controller may direct the request to the appropriate non-volatile memory device.

In some embodiments, additional security and performance enhancements may be implemented for processing access requests at an access device that utilizes an on-board MMU to direct access requests at a memory controller. For example, address scrambling techniques, such as those discussed above with regard to address scrambling 120 in FIGS. 1 and 4A-5 may be implemented to disguise access patterns, for a security enhancement, and distribute storage locations across multiple non-volatile memories and/or access channels, for a performance enhancement. Similarly, other mapping or translation operations for a storage location received from a host may be performed prior to the determination of the different storage location at the MMU. As discussed above with regard to FIGS. 1 and 5, shared virtual memory may be implemented for a virtual computing resource so that a virtual resource may operate upon storage locations as if they were physical storage locations. These resource physical storage locations may then be mapped or translated into other storage locations (e.g., before address scrambling and the final lookup/translation at the MMU at 720) which may be considered using the techniques discussed above with regard to FIG. 7.

Figure 8:
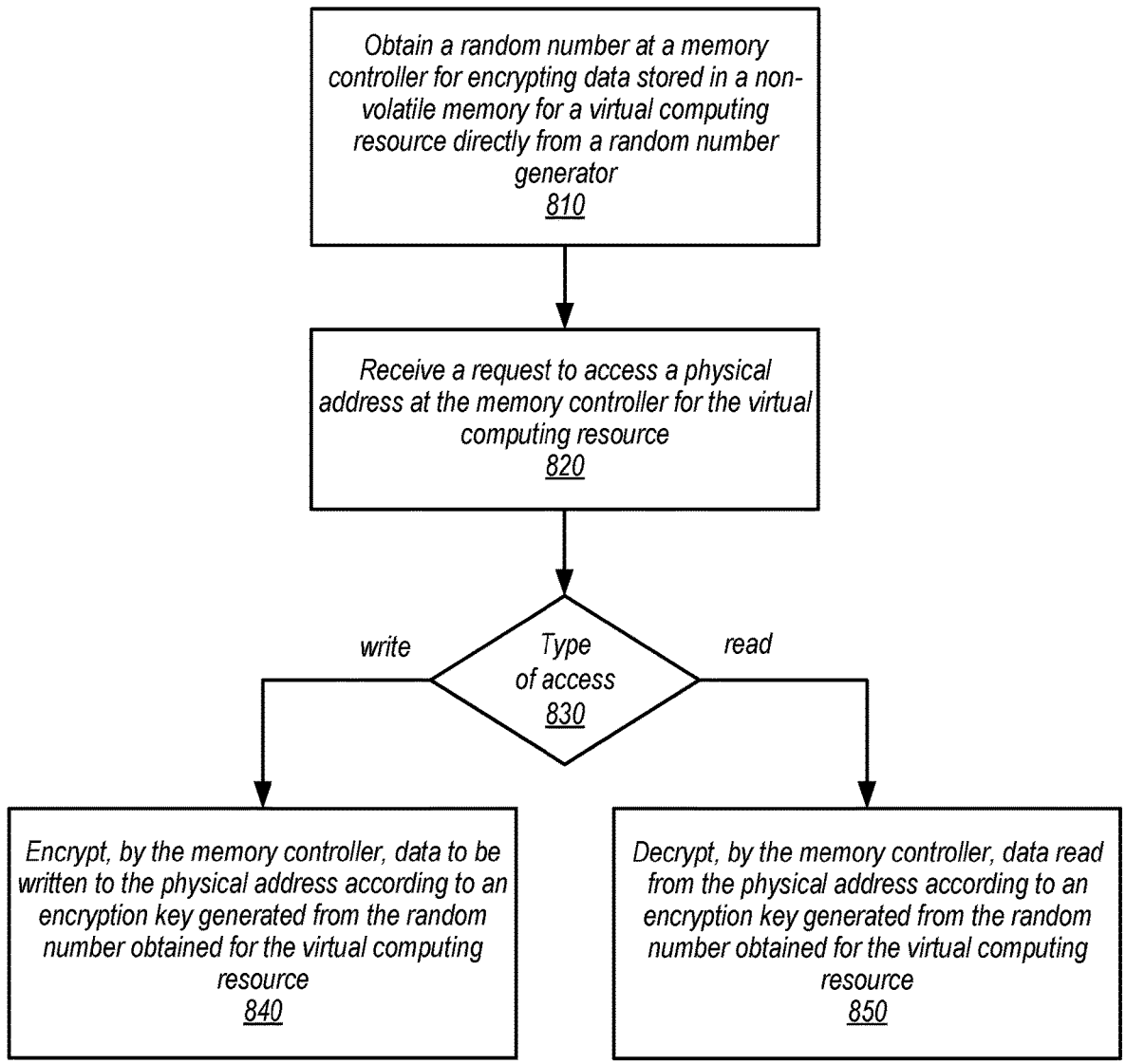
FIG. 8 is a high-level flowchart illustrating various methods and techniques to implement encryption for processing access requests at an access device, according to some embodiments.

Another enhancement that may be implemented is encryption, which may be performed entirely within the memory controller, in order to isolate encryption keys and other sensitive information from access (e.g., by a host processor or microcontroller which could be infiltrated for malicious purposes). FIG. 8 is a high-level flowchart illustrating various methods and techniques to implement encryption for processing access requests at an access device, according to some embodiments. As indicated at 810, a random number may be obtained at a memory controller for encrypting data stored in a non-volatile memory for a virtual computing resource from a random number generator, in some embodiments. For example, a direct communication line, wire, or other link may be implemented in circuitry to prevent a host processor or microcontroller from accessing the random number used to generate an encryption key.

When access requests are received, the memory controller may automatically apply encryption (or decryption) using the generated encryption key. For example, as indicated at 820, a request to access a physical address may be received at the memory controller for the virtual computing resource. The type of access request may indicate whether encryption or decryption is done, as indicated at 830. A write request, for example, may direct the memory controller to encrypt the data to be written to the physical address according to an encryption key generated from the random number obtained for the virtual computing resource, as indicated at 840, in some embodiments. A read request, for example, may direct the memory controller to decrypt the data read from the non-volatile memory at the physical address according to an encryption key generated from the random number obtained for the virtual computing resource, as indicated at 850, in various embodiments.

FIGS. 9A and 9B are logical block diagrams illustrating various configurations of access devices, host processors, non-volatile memories, and other memories, according to some embodiments. In FIG. 9A, central processing units 920*a* and 920*b* may be implemented as part of host 900. Each central processing unit 920 may communicate directly with the other central processing unit (e.g., over a PCIe or UPI link). Each central processing unit may also utilize volatile memor(ies) 930*a* and 930*b* respectively to perform operations on behalf of resources implemented at host 900. Each central processing unit 920 may also utilize an access device (similar to access device 102 in FIG. 1), such as access devices 910*a* and 910*b* to respectively access storage class memor(ies) 940*a* and 940*b*. In FIG. 9B, multiple central processing units may leverage a single access device. For example, at host 902, central processing unit 960*a* and 960*b* may both utilize access device 950 to access storage class memor(ies) 980, in addition to respective access to volatile memor(ies) 970*a* and 970*b*. Please note that the previous example embodiments for implementing an access device are not intended to be limiting. Various other numbers or configurations of central processing units, access devices, volatile memories and storage class memories may be implemented in other embodiments.

Hosts, such as host 900 or 902 may be implemented as part of standalone computer systems, or as part of a host for a service, such as a network-based service. For example, in at least some embodiments, host 900 or 902 may host implement a virtualization platform that allows clients of the network-based service to launch, provision, or otherwise implement a virtual machine instance at the host. Such instances may be offered by the network-based service as instances with large memory capacities that rely upon the capability of both volatile memory and non-volatile memory to provide a large memory offering for a virtual machine instances hosted at the hosts implementing an access device and storage class memories.

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

Embodiments of a host system which may include or interact with an access device, microcontroller, and/or memory controller as discussed above may be implemented as part of a computer system. One such computer system is illustrated by FIG. 10. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node, compute node, computing device, compute device, or electronic device.

In the illustrated embodiment, computer system 1000 includes one or more processors 1010 coupled to a system memory 1020 via an input/output (I/O) interface 1030. Computer system 1000 may include one or more access device(s) 1090 (e.g., similar to access device 102 discussed above with regard to FIG. 1) which may provide processors 1010 an access channel to one or more non-volatile memor(ies) 1092, in some embodiments. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions 1025 and data storage 1035, respectively. In other embodiments, program instructions and/or data may be received, sent or stored upon different types of computer-accessible media or on similar media separate from system memory 1020 or computer system 1000. Generally speaking, a non-transitory, computer-readable storage medium may include storage media or memory media such as magnetic or optical media, e.g., disk or CD/DVD-ROM coupled to computer system 1000 via I/O interface 1030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 2000 or may be distributed on various nodes of computer system 2000. In some embodiments, similar input/output devices may be separate from computer system 1000 and may interact with one or more nodes of computer system 1000 through a wired or wireless connection, such as over network interface 1040.

As shown in FIG. 10, memory 1020 may include program instructions 1025, that may implement the various computing resources as described herein for a host system, and data storage 1035, comprising various data accessible by program instructions 1025. In one embodiment, program instructions 1025 may include software elements of embodiments of a host (e.g., a hypervisor implementing a virtualization platform, container-based virtualization, or other hosting platforms for computing resources) as described herein and as illustrated in the Figures. Data storage 1035 may include data that may be used in embodiments. In other embodiments, other or different software elements and data may be included.

Those skilled in the art will appreciate that computer system 1000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
   a processor;
   a memory, that stores program instructions that when executed by the processor cause the processor to implement a host for a virtual computing resource, wherein the host stores data for the virtual computing resource in a byte-addressable, non-volatile memory via an access device for the non-volatile memory;
   the byte-addressable, non-volatile memory; and
   the access device for the byte-addressable, non-volatile memory, wherein the access device comprises:
     an interface;
     an interconnect;
     a management memory controller;
     a translation lookaside buffer;
     a microcontroller; and
     a memory controller;
   wherein the access device is configured to:
     send, by the microcontroller in the access device, one or more instructions via the interconnect to the management memory controller to write to a page table in another memory that maps addresses to storage locations at the non-volatile memory to allocate a portion of the byte-addressable, non-volatile memory to the virtual computing resource;
     receive, from the virtual computing resource, an instruction via the interface to cause an access request to the portion of the non-volatile memory; and
     direct the memory controller in the access device to perform the access request, wherein to direct the memory controller to perform the access request, the access device is configured to:
       evaluate the translation lookaside buffer to identify a translated storage location to perform the access request to the byte-addressable, non-volatile memory; and
       replace a storage location for the access request with the translated storage location to direct the memory controller to access the translated storage location in the byte-addressable, non-volatile memory instead of the storage location.

2. The system of claim 1, wherein to evaluate the translation lookaside buffer to identify the translated storage location, the access device is configured to access the page table in the other memory to locate an entry in the page table that indicates the translated storage location in the non-volatile memory.

3. The system of claim 1:
   wherein the access device further comprises a random number generator connected to the memory controller;
   wherein the memory controller is configured to:
     obtain a random number from the random number generator; and
     generate an encryption key for the virtual computing resource based, at least in part, on the random number; and
   wherein to perform the access request, the memory controller is configured to encrypt data written to the translated storage location in the byte-addressable, non-volatile memory according to the encryption key or decrypt data read from the translated storage location in the byte-addressable, non-volatile memory according to the encryption key.

4. The system of claim 1, wherein the access device further comprises a direct memory access (DMA) engine, wherein the instruction is an instruction to cause the DMA engine to generate the access request to move data between a virtual address in the byte-addressable, non-volatile memory and a location in the memory, and wherein the access device is further configured to:
   map the virtual address to another address prior to the direction of the memory controller to perform the access request, wherein the translated storage location is identified at the translation lookaside buffer according to the other address or a different address derived from the other address.

5. A method, comprising:
   sending, by a microcontroller in an access device for a byte-addressable, non-volatile memory, one or more instructions via an interconnect of the access device to a management memory controller in the access device to write to a page table in another memory that maps addresses to storage locations at the non-volatile memory to allocate a portion of the byte-addressable, non-volatile memory for an application executing on a host processor;
   receiving, via an interface of the access device from the host processor, an instruction to cause an access request to a portion of the byte-addressable, non-volatile memory;
   evaluating a storage location for the access request by a memory management unit in the access device for the byte-addressable, non-volatile memory to modify the access request with a translated storage location in the byte-addressable, non-volatile memory to access instead of the storage location;

sending the modified access request from the memory management unit in the access device to a memory controller in the access device; and performing, by the memory controller, the access request to the translated storage location in the byte-addressable, non-volatile memory.

6. The method of claim 5, further comprising:
applying, by the access device, an address scrambling technique to another storage location for the access request to determine a scrambled location for the access request, wherein the storage location evaluated at the memory management unit is the scrambled location.

7. The method of claim 5, wherein the application is a virtual computing resource and wherein the instruction causes a direct memory access engine at the access device to generate the access request for virtual computing resource.

8. The method of claim 7, further comprising:
determining the storage location evaluated for the access request by the memory management unit from a different storage location in the access request generated by the direct memory access engine for the virtual computing resource.

9. The method of claim 5, wherein the instruction is a load instruction or a store instruction for the host processor.

10. The method of claim 5, wherein the instruction is an I/O request to access a block of data identified at the storage location.

11. The method of claim 5:
wherein the access device comprises a random number generator;
wherein the application is a virtual computing resource;
wherein the access request is for the virtual computing resource; and
wherein the method further comprises:
before receiving the instruction:
obtaining, by the memory controller, a random number from the random number generator in the access device; and
generating, by the memory controller, an encryption key for the virtual computing resource based, at least in part, on the random number; and
wherein performing the access request to the translated storage location in the byte-addressable, non-volatile memory comprises encrypting data to be written to the translated storage location in the byte-addressable, non-volatile memory according to the encryption key or decrypting data read from the translated storage location in the byte-addressable, non-volatile memory according to the encryption key.

12. The method of claim 11, further comprising:
receiving, by the microcontroller in the access device, a request to allocate the portion of the non-volatile memory to the virtual computing resource; and
instructing, by the microcontroller, the memory controller to obtain the random number and generate the encryption key for the virtual computing resource as part of the allocating the portion of the byte-addressable, non-volatile memory to the virtual computing resource.

13. The method of claim 5, wherein the host processor, the access device, and the non-volatile memory are implemented as part of a host in a network-based service that implements virtual computing resources to clients of the network-based service, and wherein the application is a virtual machine instance.

14. An access device for a non-volatile memory, the access device comprising circuitry configured to:
send, by a microcontroller in the access device, one or more instructions via an interconnect in the access device to a management memory controller in the access device to write to a page table in another memory that maps addresses to storage locations at the non-volatile memory to allocate a portion of the byte-addressable, non-volatile memory to an application executing on a host processor;
receive, via an interface of the access device and from the host processor, an instruction to cause an access request to the portion of the byte-addressable, non-volatile memory;
compare a storage location for the access request with entries in a translation lookaside buffer in the access device to identify a translated storage location corresponding to a matching one of the entries;
modify the access request to replace the storage location in the access request with the translated storage location;
direct the modified access request with the translated storage location to a memory controller in the access device; and
perform, by the memory controller, the access request to the translated storage location in the byte-addressable, non-volatile memory.

15. The access device of claim 14:
wherein the access device further comprises a random number generator connected to the memory controller;
wherein the circuitry of the access device is further configured to:
obtain, by the memory controller, a random number from the random number generator; and
generate, by the memory controller, an encryption key for the virtual computing resource based, at least in part on the random number; and
wherein to perform the access request, the circuitry of the access device is configured to encrypt, by the memory controller, data written to the physical address in the byte-addressable, non-volatile memory according to the encryption key or decrypt data read from the physical address in the byte-addressable, non-volatile memory according to the encryption key.

16. The access device of claim 15, wherein the application is a virtual computing resource, wherein the microcontroller executes firmware that causes the microcontroller to instruct the memory controller to obtain the random number and generate the key for virtual computing resource as part of the allocating the portion of the byte-addressable, non-volatile memory to the virtual computing resource.

17. The access device of claim 14, wherein the circuitry of the access device is further configured to:
receive via the interface of the access device and from the host processor, an instruction to cause another access request to the byte-addressable, non-volatile memory;
compare another storage location for the other access request with the entries in the translation lookaside buffer in the access device to determine that the other storage location does not match one of the entries in the translation lookaside buffer;
access the page table in the memory to locate an entry in the page table that matches the other storage location and indicates a different translated storage location in the byte-addressable, non-volatile memory;

modify the other access request to replace the other storage location in the access request with the different translated storage location;

direct the other access request modified with the different translated storage location to the memory controller in the access device; and perform, by the memory controller, the other access request to the different translated storage location in the byte-addressable, non-volatile memory.

18. The access device of claim 14, wherein the circuitry of the access device is further configured to:

receive, via a different interface of the access device and from a different host processor, an instruction to cause another access request to the byte-addressable, non-volatile memory;

compare another storage location for the other access request with the entries in the translation lookaside buffer at the access device to identify a different translated storage location corresponding to a different one of the entries;

modify the other access request to replace the other storage location in the other access request with the different translated storage location;

direct the modified other access request with the different translated storage location to the memory controller in the access device; and perform, by the memory controller, the access request to the different translated storage location in the byte-addressable, non-volatile memory.

19. The access device of claim 14, wherein the circuitry of the access device is further configured to:

apply an address scrambling technique to a virtual storage location for the access request to determine a scrambled location for the access request, wherein the scrambled location is the storage location compared with the entries in the translation lookaside buffer to identify the translated storage location.

20. The access device of claim 14, wherein the access device is implemented on an application specific integrated circuit (ASIC), a system-on-chip (SoC), or a field-programmable gate array (FPGA).

* * * * *